(12) United States Patent
Anderson et al.

(10) Patent No.: US 9,613,861 B2
(45) Date of Patent: Apr. 4, 2017

(54) DAMASCENE WIRES WITH TOP VIA STRUCTURES

(71) Applicant: GLOBALFOUNDRIES Inc., George Town (KY)

(72) Inventors: Brent A. Anderson, Jericho, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/818,419

(22) Filed: Aug. 5, 2015

(65) Prior Publication Data

US 2017/0040216 A1    Feb. 9, 2017

(51) Int. Cl.
| H01L 21/768 | (2006.01) |
| H01L 23/522 | (2006.01) |
| H01L 23/532 | (2006.01) |
| H01L 23/528 | (2006.01) |

(52) U.S. Cl.
CPC .. H01L 21/76897 (2013.01); H01L 21/76829 (2013.01); H01L 21/76843 (2013.01); H01L 23/5226 (2013.01); H01L 23/5283 (2013.01); H01L 23/53238 (2013.01)

(58) Field of Classification Search
CPC ............. H01L 21/768; H01L 21/76897; H01L 21/76808; H01L 23/522; H01L 23/532
See application file for complete search history.

(56) References Cited

U.S. PATENT DOCUMENTS

| 6,040,243 | A | 3/2000 | Li et al. |
| 6,211,085 | B1 | 4/2001 | Liu |
| 6,372,647 | B1 | 4/2002 | Lu et al. |
| 6,472,124 | B1 * | 10/2002 | Chung ............... H01L 28/60 257/E21.009 |
| 6,611,060 | B1 * | 8/2003 | Toyoda ............ H01L 21/31053 257/750 |
| 6,734,559 | B1 * | 5/2004 | Yang ................. H01L 21/76843 257/750 |
| 7,230,336 | B2 | 6/2007 | Adams et al. |
| 7,550,822 | B2 | 6/2009 | Lee et al. |
| 8,124,971 | B2 * | 2/2012 | Tanaka ............... H01L 27/101 257/209 |
| 8,735,278 | B2 | 5/2014 | Lee et al. |
| 2002/0086533 | A1 * | 7/2002 | Jang ................ H01L 23/53238 438/689 |
| 2002/0155693 | A1 | 10/2002 | Hong et al. |
| 2005/0189653 | A1 * | 9/2005 | Tao ................... H01L 21/76804 257/758 |
| 2009/0017620 | A1 | 1/2009 | Oda |

(Continued)

FOREIGN PATENT DOCUMENTS

KR    1020030085915 A    1/2004

*Primary Examiner* — Phuc Dang
(74) *Attorney, Agent, or Firm* — David Cain; Andrew M. Calderon; Roberts Mlotkowski Safran Cole & Calderon, P.C.

(57) ABSTRACT

Damascene wires with top via structures and methods of manufacture are provided. The semiconductor structure includes a damascene wiring structure with an integrally formed top via structure in self-alignment with the damascene wiring structure which is underneath the integrally formed top via structure.

17 Claims, 5 Drawing Sheets

(56) References Cited

U.S. PATENT DOCUMENTS

2010/0022084 A1* 1/2010 Chen ................ H01L 21/02134
                                                                438/637
2013/0320544 A1    12/2013 Lin et al.
2014/0019716 A1*  1/2014 Jezewski ........... H01L 23/53223
                                                                712/32
2014/0225261 A1    8/2014 Lee et al.
2014/0342549 A1* 11/2014 Holmes ............. H01L 21/76883
                                                                438/634

* cited by examiner

DAMASCENE WIRES WITH TOP VIA STRUCTURES

FIELD OF THE INVENTION

The invention relates to semiconductor structures and, more particularly, to damascene wires with top via structures and methods of manufacture.

BACKGROUND

The formation of high quality interconnects is a critical part of ultra large-scale integration (ULSI) integrated circuits. In conventional fabrication processes, vias and upper wiring structures are formed in a dual damascene process. In this type of process, via openings and trenches are formed in a dielectric layer prior to the deposition of metal materials.

In dual damascene processes, though, the via openings have a tapered edge with a smaller cross sectional area (width) at the bottom of the opening than at a top of the opening. Due to this dimensional configuration, via resistance and manufacturability has been degrading at advanced nodes. For example, due to scaling, via resistance has been increasing by greater than 2× the rate of wires. Also, etching and filling of the via openings are becoming increasingly difficult in these advanced nodes. For example, it is becoming ever more difficult to place liners within the via openings without completely filling the via openings with highly resistive material. Also, it becomes very difficult to align the via openings with an underlying metal wiring layer.

SUMMARY

In an aspect of the invention, a semiconductor structure comprises a damascene wiring structure with an integrally formed top via structure in self-alignment with the damascene wiring structure which is underneath the integrally formed top via structure.

In an aspect of the invention, a structure comprises: a damascene wiring structure formed in a dielectric layer; a top etched via structure in self-alignment with the damascene wiring structure; and a liner on vertical sidewalls of the damascene wiring structure and the top etched via structure.

In an aspect of the invention, a method comprises: forming a damascene wiring structure in a trench formed in a dielectric layer; and etching the damascene wiring to form an integrally formed via structure in self alignment with the damascene wiring.

BRIEF DESCRIPTION OF THE DRAWINGS

The present invention is described in the detailed description which follows, in reference to the noted plurality of drawings by way of non-limiting examples of exemplary embodiments of the present invention.

FIG. 1b shows a top view of the wiring structure of FIG. 1a.

FIG. 2b shows a top view of the integrally formed via structure of FIG. 2a.

FIG. 5b shows a top view of the wiring structure of FIG. 5a.

DETAILED DESCRIPTION

The invention relates to semiconductor structures and, more particularly, to damascene wires with top via structures and methods of manufacture. More specifically, the present invention includes a copper damascene wiring with an etched via top integrally formed from the copper damascene wiring. Advantageously, the integrally formed etched via top provides improved via resistance, fill properties and via image size control, amongst other advantages.

In particular, moving to a damascene wire with an integrally formed top via structure results in improved via resistance and manufacturability compared to conventional dual damascene processes. For example, by implementing the processes described herein via size can be increased substantially thus decreasing via resistance compared to conventional fabrication processes. More specifically and by way of illustrative example, the top width of the via structure can be lithography defined to match a size of the upper wiring structure. Moreover, by implementing the processes described herein, improved etch and fill aspect ratios are possible which enables, e.g., use of thinner liners and liners at the bottom of upper wiring structure in contact with the vias. In addition, the via structure can be self-aligned with the underlying damascene wiring.

The damascene wires with top via structures of the present invention can be manufactured in a number of ways using a number of different tools. In general, though, the methodologies and tools are used to form structures with dimensions in the micrometer and nanometer scale. The methodologies, i.e., technologies, employed to manufacture the damascene wires with top via structures of the present invention have been adopted from integrated circuit (IC) technology. For example, the structures of the present invention are built on wafers and are realized in films of material patterned by photolithographic processes on the top of a wafer. In particular, the fabrication of the damascene wires with top via structures of the present invention uses three basic building blocks: (i) deposition of thin films of material on a substrate, (ii) applying a patterned mask on top of the films by photolithographic imaging, and (iii) etching the films selectively to the mask.

Figure 1A:
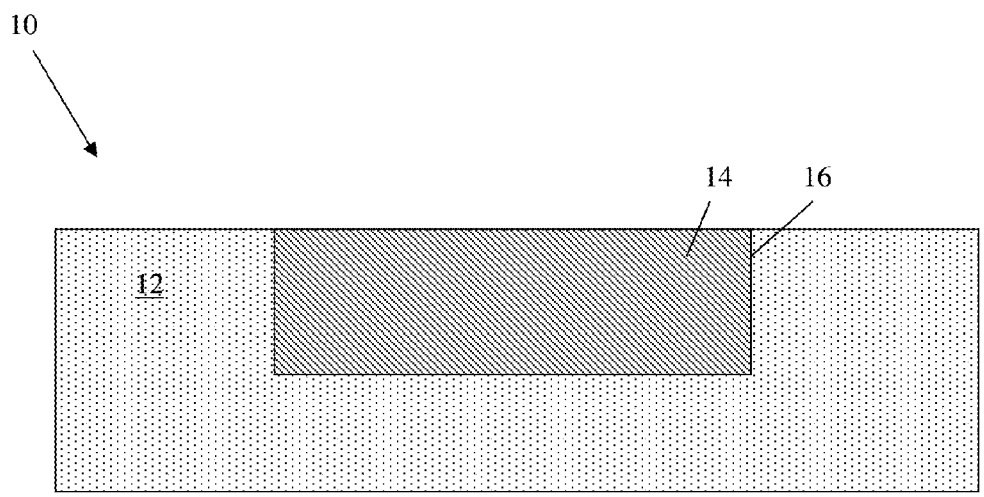
FIG. 1a shows a cross-sectional view of a wiring structure and respective fabrication processes in accordance with aspects of the invention.
Figure 1B:
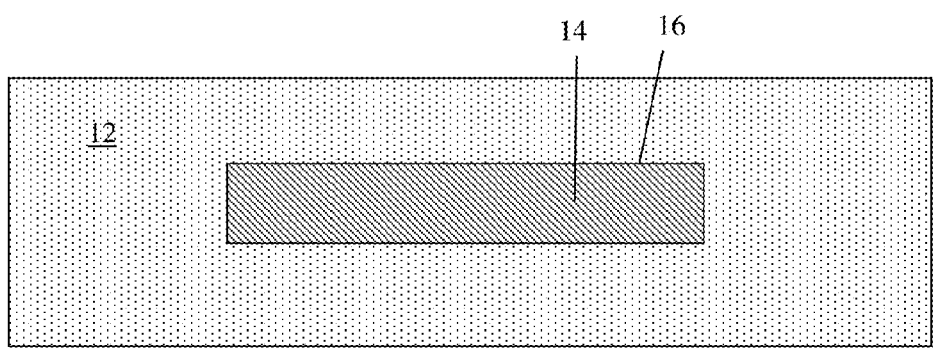

FIG. 1a shows a cross-sectional view of a wiring structure and respective fabrication processes in accordance with aspects of the invention; whereas, FIG. 1b shows a top view of the wiring structure of FIG. 1a. More specifically and referring to both FIGS. 1a and 1b, the structure 10 includes a damascene wire 14 formed in an interlevel dielectric material 12, e.g., oxide material. In embodiments, a liner 16 is formed about the damascene wire 14, e.g., on vertical side surfaces and a bottom portion. In embodiments, the damascene wire 14 can be a copper material and the liner 16 can be any material that prevents electromigration, e.g., tungsten cobalt, tantalum (Ta), TaN, TiN or combinations thereof. Although not critical to the understanding of the present invention, the damascene wire 14 can be about 30 nm wide with a pitch of about 48 nm, depending on the technology node.

In embodiments, the damascene wire 14 and liner 16 can be formed using conventional damascene processes. For example, a photoresist material formed on the interlevel dielectric material 12 is exposed to light to form a pattern (e.g., an opening corresponding to the damascene wire 14). A trench is formed in the interlevel dielectric material 12 by etching through the opening using conventional etchants in a reactive ion etching (RIE) process. The resist can then be removed using conventional stripants such as oxygen ashing techniques. In embodiments, the trench is filled with a liner material followed by a metal fill, e.g., copper, using a conventional deposition process.

In embodiments, the liner 16, e.g., tungsten cobalt, can be deposited on the bottom and vertical sidewalls of the trench using plasma enhanced chemical vapor deposition (PECVD) processes. In embodiments, the thickness of the liner 16 on the sidewalls can be about 3-4 nm and the thickness of the liner 16 on the bottom can be bout 5-10 nm; although other dimensions are also contemplated by the present invention. The remaining portions of the trench can be filled with copper using conventional electroplating processes. In embodiments, other conductive metal or metal alloys are also contemplated by the present invention. Any residual material on the upper surface of the interlevel dielectric material 12 can be removed using a conventional chemical mechanical polishing (CMP) process.

Figure 2A:
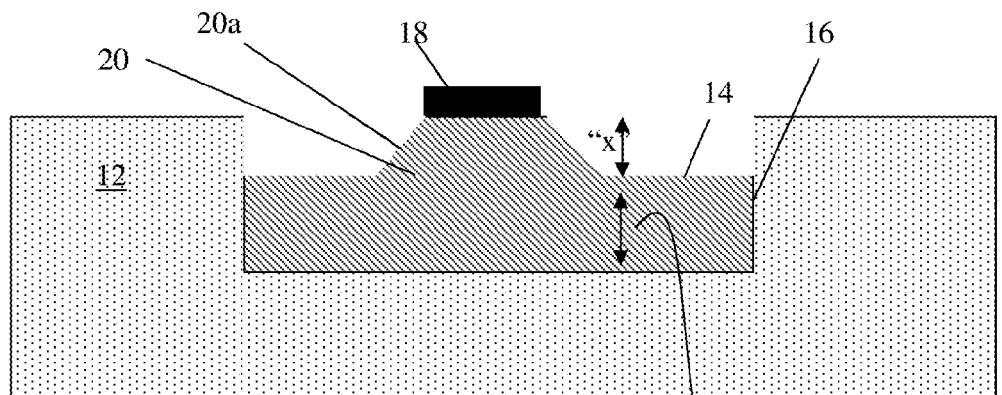
FIG. 2a shows a cross-sectional view of an integrally formed via structure and respective fabrication processes in accordance with aspects of the invention.
Figure 2B:
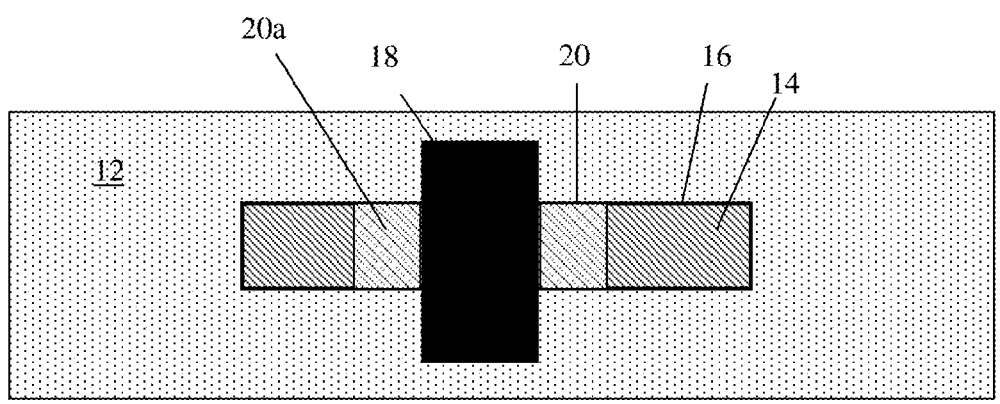

FIG. 2a shows a cross-sectional view of an integrally formed via structure 20 formed from an upper portion of the damascene wire 14. FIG. 2b shows a top view of integrally formed via structure 20 of FIG. 2a. In FIGS. 2a and 2b, the via structure 20 is formed from an upper portion of the damascene wiring 14, and includes sloped sidewalls 20a with the bottom of the top via 20 having a larger dimension, e.g., width, than the upper portion of the via structure 20. In embodiments, as the via structure 20 is integrally formed from the damascene wire 14, both the via structure 20 and the damascene wire 14 will be composed of the same material and a full width of the via structure 20 is self aligned to the below damascene wire 14.

In embodiments, the via structure 20 with sloped sidewalls 20a is formed using lithography and etching processes (e.g., RIE). More specifically, a mask 18 formed on the damascene wire 14 is exposed to light to form a pattern. In embodiments, the mask 18 is placed directly on the damascene wire 14 which provides excellent controllability and little variability for the etching process, enabling precise control of the dimensions of the integrally formed top via structure 20. Through a timed etching process, e.g., RIE, the damascene wire 14 is etched to form the via structure 20 with sloped sidewalls 20a, automatically aligned with the damascene wire 14. As should be understood by those of skill in the art, the liner 16 will be provided on vertical sidewalls of the via structure 20 as shown in FIG. 2b.

In embodiments, the depth of the etch, e.g., height "x" of the integrally formed via structure 20, can be approximately equivalent to the thickness "y" of the resultant damascene wire 14. In embodiments, the dimensions "x" and "y" are pitch driven, e.g., based on a technology node. Once the etching is completed, the mask 18 can be removed using conventional stripants such as oxygen ashing techniques.

Figure 3:
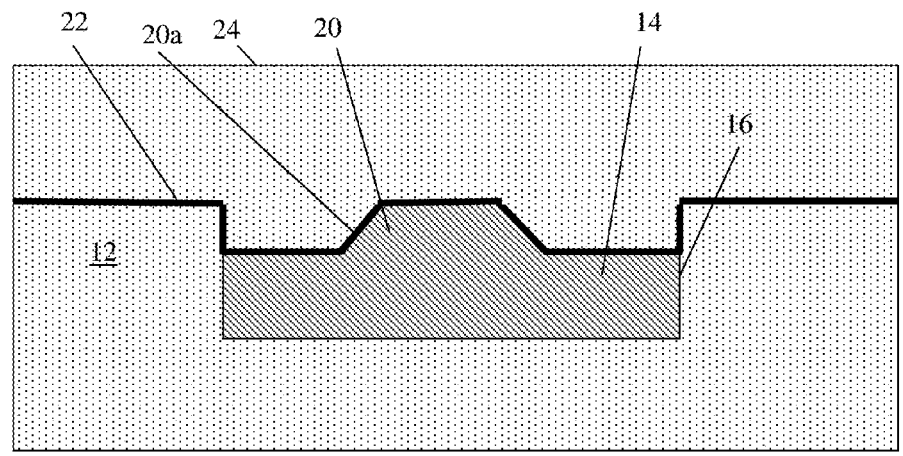
FIG. 3 shows a cross-sectional view of a liner formed on the wiring structure and integrally formed via structure of FIGS. 2a and 2b and respective fabrication processes in accordance with aspects of the invention.

In FIG. 3, a liner 22 is formed on the integrally formed via structure 20 and sloped sidewalls 20a (formed on top of the damascene wire 14), in addition to any remaining exposed surfaces of the interlevel dielectric material 12. In embodiments, the liner 22 can be a capping layer of SiN. In alternative embodiments, the liner 22 can be SiCN or other materials that seal, e.g., prevent electromigration, the metal material of the integrally formed via structure 20 and damascene wire 14. In embodiments, the liner 22 can be formed using conventional CVD processes. The liner 22 can be about 10 nm thick for a 48 nm pitch wire; although other dimensions are also contemplated by the present invention.

Still referring to FIG. 3, an interlevel dielectric material 24 is formed over the liner 22 using conventional deposition processes. In embodiments, the interlevel dielectric material 24 can be an oxide material, e.g. $SiO_2$, or a low-k dielectric material. The interlevel dielectric material 24 can optionally be planarized using a CMP process.

Figure 4:
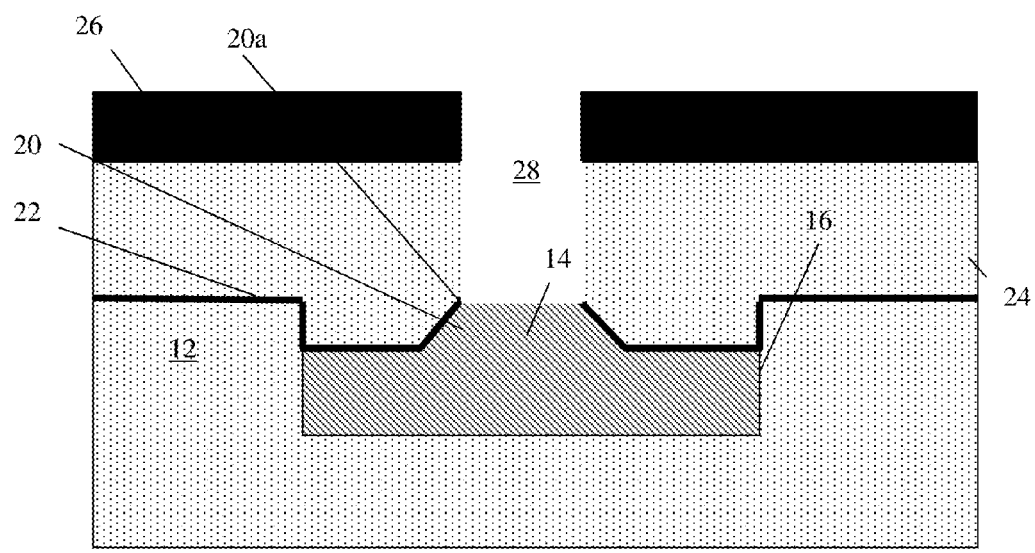
FIG. 4 shows a cross-sectional view of a trench aligned with the integrally formed via structure of FIG. 3, and respective fabrication processes in accordance with aspects of the invention.

Referring to FIG. 4, a mask (photoresist) 26 is formed over the interlevel dielectric material 24. The mask 24 is exposed to light to form a pattern, e.g., an opening aligned with the integrally formed via structure 20. A vertical opening 28 is formed in the interlevel dielectric material 24 by conventional etching processes, e.g., a reactive ion etching (RIE) process, to expose the underlying integrally formed via structure 20. In embodiments, the vertical opening 28 and hence the subsequently formed wiring structure can be accurately matched or aligned with the via structure 20. The resist can then be removed using conventional stripants such as oxygen ashing techniques.

Figure 5A:
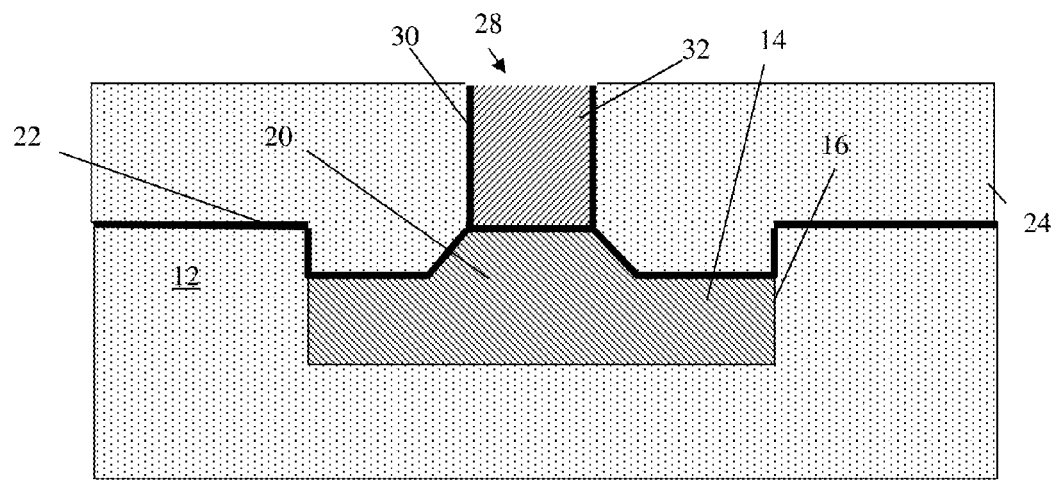
FIG. 5a shows a cross-sectional view of a wiring structure formed on the integrally formed via structure and respective fabrication processes in accordance with aspects of the invention.
Figure 5B:
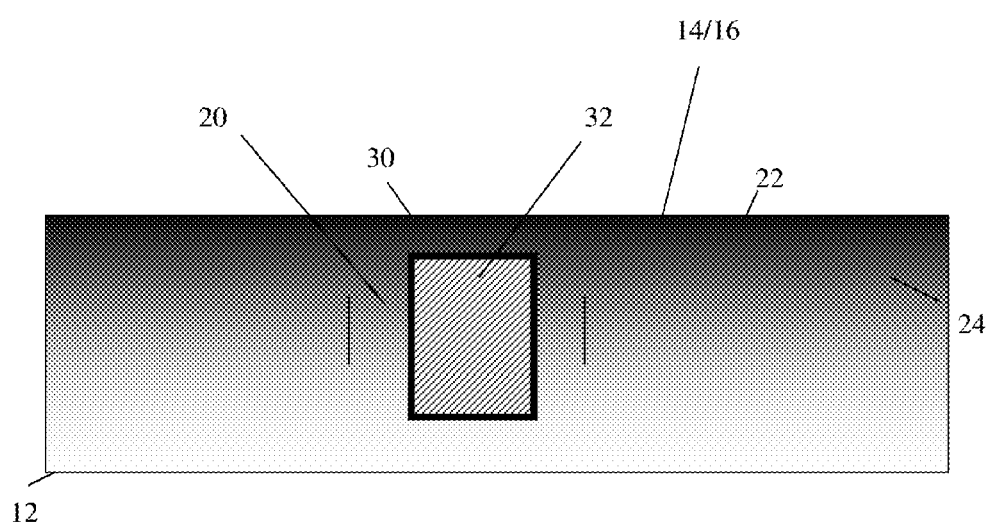

FIG. 5a shows a cross-sectional view of a wiring structure 32 formed on the integrally formed via structure 20 invention. FIG. 5b shows a top view of the wiring structure 32 of FIG. 5a. In more specific embodiments, a liner 30 and wiring structure 32 are formed in the opening 28, in direct alignment and contact with the integrally formed via structure 20 formed from the damascene wire 14. As shown in FIGS. 5a and 5b, a liner (e.g., liner 22 and liner 30) is provided on the sidewalls of the damascene wire 14, the integrally formed via structure 20 and the wiring structure 32.

The liner 30 can be any capping material that prevents electromigration, e.g., tungsten cobalt, TaN, TiN or combinations thereof. The wiring structure 32 can be, e.g., copper. In embodiments, the liner 30 can be formed using conventional PECVD processes and the wiring structure 32 can be formed using an electroplating process. In embodiments, the thickness of the liner 30 on the sidewalls of the wiring structure 32 can be about 3-4 nm and the thickness of the liner 30 on the bottom of the wiring structure 32 can be about 5-10 nm; although other dimensions are also contemplated by the present invention. Any residual material deposited on the interlevel dielectric material 24 can be removed by a CMP process.

Figure 6:
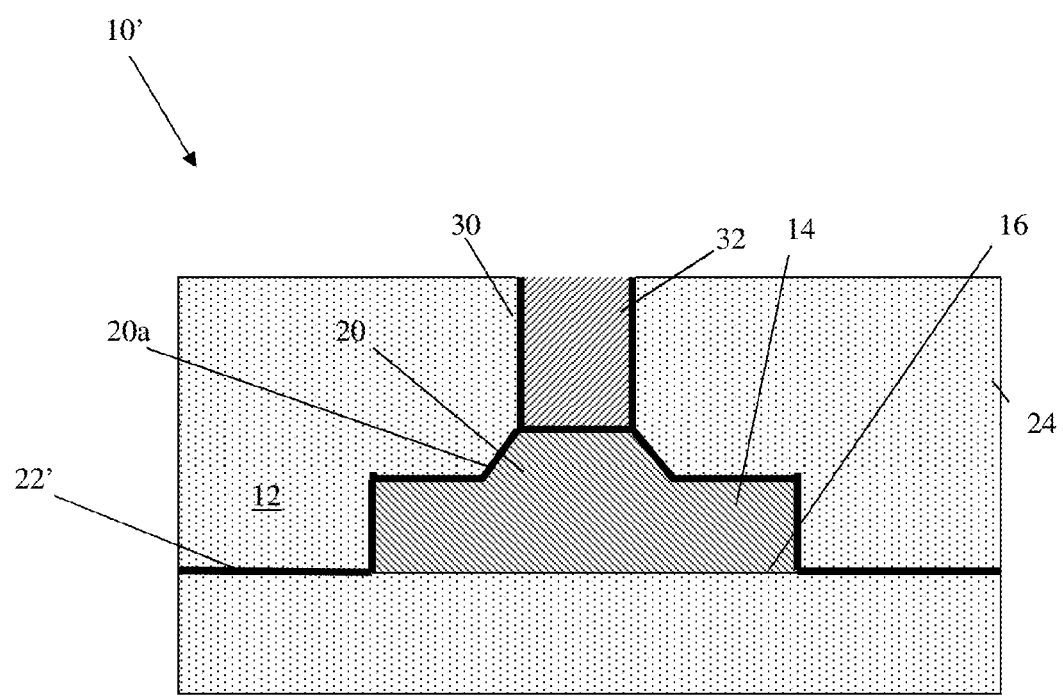
FIG. 6 shows a cross-sectional view of an alternative wiring structure and integrally formed via structure and respective fabrication processes in accordance with aspects of the invention.

FIG. 6 shows a cross-sectional view of an alternative wiring structure and integrally formed via structure in accordance with aspects of the invention. In this embodiment, the structure 10' includes a liner 22' formed on the integrally formed via structure 20 (including sloped sidewalls 20a), in addition to any exposed surfaces of the damascene wire 14. In this fabrication process, for example, the ends of the damascene wire 14 can be cut by an etching process, e.g., removing the end portions of the damascene wire 14 during the formation of the top via 20, followed by a deposition of the liner 22'.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure comprising a damascene wiring structure with an integrally formed top via structure in self-alignment with the damascene wiring structure which is underneath the integrally formed top via structure,
   wherein the damascene wiring structure has cut ends.

2. The semiconductor structure of claim 1, further comprising a liner on vertical sidewalls of the damascene wiring structure and the integrally formed top via structure.

3. The semiconductor structure of claim 2, wherein the liner is further provided on a top surface of the damascene wiring structure and sloped sidewalls of the integrally formed top via structure.

4. The semiconductor structure of claim 3, wherein the sloped sidewalls form a lower portion having a wider width than an upper portion.

5. The semiconductor structure of claim 4, wherein the liner on the vertical sidewalls of the damascene structure comprises silicon nitride.

6. The semiconductor structure of claim 5, wherein the sloped sidewalls are downward sloping such that the lower portion of the integrally formed top via structure has the wider width than the upper portion of the integrally formed top via structure.

7. The semiconductor structure of claim 1, further comprising a wiring structure in direct electrical contact with an upper portion of the integrally formed top via structure.

8. The semiconductor structure of claim 7, wherein the wiring structure includes a liner formed on its sidewalls and on a top surface of the integrally formed top via structure.

9. The semiconductor structure of claim 1, wherein the cut ends of the damascene wiring structure are covered with a liner.

10. The semiconductor structure of claim 1, wherein the damascene wiring structure is a copper damascene wire.

11. The semiconductor structure of claim 1, wherein the integrally formed top via structure and the damascene wiring structure are of a same material.

12. A structure comprising:
    a damascene wiring structure formed in a dielectric layer;
    a top etched via structure in self-alignment with the damascene wiring structure; and
    a liner on vertical sidewalls of the damascene wiring structure and the top etched via structure,
    wherein the liner is provided on a top surface of the damascene wiring structure and sloped sidewalls of the top etched via structure, and
    the damascene wiring structure has cut ends which are covered with the liner.

13. The semiconductor structure of claim 12, wherein:
    the sloped sidewalls form a lower portion in contact with the damascene wiring structure having a wider width than an upper portion.

14. The semiconductor structure of claim 13, further comprising a wiring structure in direct electrical contact with an upper portion of the etched via structure and a liner on sidewalls of the wiring structure and on a top surface of the etched via structure.

15. The semiconductor structure of claim 12, wherein the damascene wiring structure is a copper damascene wire.

16. The semiconductor structure of claim 15, wherein the top etched via structure and the damascene wiring structure are of a same material.

17. The semiconductor structure of claim 12, further comprising another liner on a bottom surface of the top etched via structure,
    wherein the another liner comprises tungsten cobalt and has a thickness of about 5-10 nm, and the sloped sidewalls are downward sloping.

* * * * *